(12) United States Patent
De Jong

(10) Patent No.: US 8,339,572 B2
(45) Date of Patent: Dec. 25, 2012

(54) LITHOGRAPHIC APPARATUS AND DEVICE MANUFACTURING METHOD

(75) Inventor: Anthonius Martinus Cornelis Petrus De Jong, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 977 days.

(21) Appl. No.: 12/358,000

(22) Filed: Jan. 22, 2009

(65) Prior Publication Data

US 2009/0190105 A1 Jul. 30, 2009

Related U.S. Application Data

(60) Provisional application No. 61/006,661, filed on Jan. 25, 2008.

(51) Int. Cl.
*G03B 27/42* (2006.01)
*G03B 27/54* (2006.01)
*G03B 27/58* (2006.01)

(52) U.S. Cl. ............................. 355/53; 355/67; 355/72

(58) Field of Classification Search ............... 355/53, 355/67, 30
See application file for complete search history.

(56) References Cited

U.S. PATENT DOCUMENTS

| | | | |
|---|---|---|---|
| 4,509,852 A | 4/1985 | Tabarelli et al. | |
| 6,496,257 B1 | 12/2002 | Taniguchi et al. | 356/239.2 |
| 6,563,565 B2 * | 5/2003 | Nishi | 355/53 |
| 7,050,146 B2 | 5/2006 | Duineveld et al. | |
| 7,061,575 B2 | 6/2006 | Taniguchi et al. | |
| 7,091,502 B2 | 8/2006 | Gau et al. | 250/492.2 |
| 7,224,427 B2 | 5/2007 | Chang et al. | 355/30 |
| 7,224,434 B2 | 5/2007 | Tokita | 355/53 |
| 7,307,263 B2 | 12/2007 | Bakker et al. | 250/492.2 |
| 7,315,033 B1 | 1/2008 | Pawloski et al. | 250/492.2 |
| 7,385,670 B2 | 6/2008 | Compen et al. | 355/30 |
| 7,405,417 B2 | 7/2008 | Stevens et al. | 250/504 R |
| 7,462,850 B2 | 12/2008 | Banine et al. | 250/504 R |
| 2004/0136494 A1 | 7/2004 | Lof et al. | |
| 2004/0207824 A1 | 10/2004 | Lof et al. | |
| 2005/0024609 A1 | 2/2005 | De Smit et al. | 355/18 |

(Continued)

FOREIGN PATENT DOCUMENTS

CN  1963673  5/2007

(Continued)

OTHER PUBLICATIONS

Japanese Office Action mailed May 24, 2011 in corresponding Japanese Patent Application No. 2009-012975.

(Continued)

*Primary Examiner* — Peter B Kim
(74) *Attorney, Agent, or Firm* — Pillsbury Winthrop Shaw Pittman LLP

(57) ABSTRACT

Contaminants may build up on surfaces of an immersion lithographic apparatus that come into contact with an immersion liquid from during exposure of a substrate. A solution containing a cleaning agent may be used to clean such surfaces. The cleaning properties of such a cleaning solution may be improved by activating it with ultraviolet radiation. This means that a solution of a lower concentration may be used, thereby reducing the risk of damaging the surfaces to which the cleaning solution is provided. An embodiment of the present invention allows ultraviolet radiation to be provided to surfaces being cleaned without having to take the apparatus off-line. In an embodiment, a guide member is used to transfer ultraviolet radiation from a remote radiation source to an outlet located at a position where it is desired for a cleaning operation.

29 Claims, 5 Drawing Sheets

U.S. PATENT DOCUMENTS

| | | |
|---|---|---|
| 2005/0175776 A1 | 8/2005 | Streefkerk et al. ............ 427/256 |
| 2005/0264774 A1 | 12/2005 | Mizutani et al. ................ 355/30 |
| 2005/0274898 A1 | 12/2005 | Watanabe et al. ............. 250/372 |
| 2006/0023185 A1 | 2/2006 | Hazelton et al. ................ 355/53 |
| 2006/0038968 A1 | 2/2006 | Kemper et al. |
| 2006/0050351 A1 | 3/2006 | Higashiki ..................... 359/228 |
| 2006/0103818 A1 | 5/2006 | Holmes et al. .................. 355/53 |
| 2006/0132731 A1 | 6/2006 | Jansen et al. .................... 355/30 |
| 2006/0158627 A1 | 7/2006 | Kemper et al. |
| 2006/0232757 A1 | 10/2006 | Tani et al. ........................ 355/53 |
| 2006/0250588 A1 | 11/2006 | Brandl ............................. 355/30 |
| 2006/0256316 A1 | 11/2006 | Tanno et al. ..................... 355/72 |
| 2007/0002296 A1 | 1/2007 | Chang et al. ..................... 355/53 |
| 2007/0026345 A1 | 2/2007 | Subramanian et al. ........ 430/311 |
| 2007/0064215 A1 | 3/2007 | Dirksen et al. .................. 355/77 |
| 2007/0076197 A1 | 4/2007 | Koga ........................ 356/237.3 |
| 2007/0085989 A1 | 4/2007 | Nagahashi et al. ............. 355/53 |
| 2007/0091287 A1 | 4/2007 | Chang et al. ..................... 355/30 |
| 2007/0127001 A1 | 6/2007 | Van Der Hoeven ............ 355/53 |
| 2007/0146657 A1 | 6/2007 | Van Mierlo et al. ............ 355/30 |
| 2007/0146658 A1 | 6/2007 | Van Mierlo et al. ............ 355/30 |
| 2007/0159610 A1 | 7/2007 | Shiraishi ......................... 355/53 |
| 2007/0172234 A1 | 7/2007 | Shigemori et al. ............ 396/611 |
| 2007/0206279 A1 | 9/2007 | Brueck et al. .................. 359/391 |
| 2007/0229789 A1 | 10/2007 | Kawamura ...................... 355/53 |
| 2007/0247600 A1 | 10/2007 | Kobayashi et al. ............. 355/30 |
| 2007/0251543 A1 | 11/2007 | Singh ................................ 134/1 |
| 2007/0253710 A1 | 11/2007 | Kaneyama et al. ........... 396/611 |
| 2007/0258072 A1 | 11/2007 | Nagasaka et al. ............... 355/53 |
| 2007/0274711 A1 | 11/2007 | Kaneyama et al. ........... 396/611 |
| 2007/0285631 A1 | 12/2007 | Stavenga et al. ................ 355/30 |
| 2008/0002162 A1 | 1/2008 | Jansen et al. ..................... 355/30 |
| 2008/0049201 A1 | 2/2008 | Stavenga et al. ................ 355/30 |
| 2008/0198343 A1* | 8/2008 | Sewell et al. .................... 355/30 |
| 2008/0218712 A1 | 9/2008 | Compen et al. ................. 355/30 |
| 2008/0273181 A1 | 11/2008 | De Jong et al. ................. 355/30 |
| 2008/0284990 A1 | 11/2008 | De Jong et al. ................. 355/30 |
| 2009/0025753 A1 | 1/2009 | De Jong et al. ................. 134/10 |
| 2009/0027635 A1 | 1/2009 | De Jong et al. ................. 355/30 |
| 2009/0027636 A1 | 1/2009 | Leenders et al. ................ 355/30 |

FOREIGN PATENT DOCUMENTS

| | | |
|---|---|---|
| EP | 1420300 A2 | 5/2004 |
| JP | 11-283903 | 10/1999 |
| JP | 2000-323396 | 11/2000 |
| JP | 2005-072404 | 3/2005 |
| JP | 2005-079222 | 3/2005 |
| JP | 2005-236047 | 9/2005 |
| JP | 2006-134999 | 5/2006 |
| JP | 2006-165502 | 6/2006 |
| JP | 2006-310706 | 11/2006 |
| JP | 2007-029973 | 2/2007 |
| JP | 2007-088328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| WO | 99/49504 A1 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

Kadijk et al., U.S. Appl. No. 12/233,000, filed Sep. 26, 2008.
Streefkerk et al., U.S. Appl. No. 12/237,557, filed Sep. 25, 2008.
De Jong et al., U.S. Appl. No. 12/289,621, filed Oct. 30, 2008.
De Jong et al., U.S. Appl. No. 12/314,611, filed Dec. 12, 2008.
De Graaf et al., U.S. Appl. No. 12/318,037, filed Dec. 19, 2008.

* cited by examiner

LITHOGRAPHIC APPARATUS AND DEVICE MANUFACTURING METHOD

This application claims priority and benefit under 35 U.S.C. §119(e) to U.S. Provisional Patent Application No. 61/006,661, entitled "Lithographic Apparatus and Device Manufacturing Method", filed on Jan. 25, 2008. The content of that application is incorporated herein in its entirety by reference.

FIELD

The present invention relates to a lithographic apparatus and a method for irradiating surfaces of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid may be used. An embodiment of the present invention will be described with reference to liquid. However, another fluid may be suitable, particularly a wetting fluid, an incompressible fluid and/or a fluid with higher refractive index than air, desirably a higher refractive index than water. The point of this is to enable imaging of smaller features since the exposure radiation will have a shorter wavelength in the fluid. (The effect of the fluid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, a fluorohydrocarbon, and/or an aqueous solution.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

There is a desire to address the issue of contamination in a lithographic apparatus, in particular an immersion lithographic apparatus. In particular, there is a desire to address the issue of contamination generated by the deposition and/or removal of particles of top-coat material, and/or substrate material, and/or any other contaminating material.

SUMMARY

Current cleaning methods generally do not allow for in-line cleaning. Accordingly, completion of cleaning using current methods may cause significant down-time of the lithographic apparatus.

It is desirable, for example, to provide an improved lithographic apparatus and cleaning method for dealing with contamination in an immersion type projection apparatus which addresses one or more of the problems discussed above or one of more other problems.

According to an aspect of the invention there is provided an immersion lithographic apparatus comprising a cleaning unit configured to clean at least a part of a surface that is covered by immersion fluid during exposure of the substrate. The cleaning unit comprises a radiation source configured to emit a radiation beam. The cleaning unit also comprises a radiation outlet configured to direct the radiation beam to a portion of the surface when cleaning the portion. The cleaning unit also comprises a guide member for guiding the radiation from the radiation source to the radiation outlet through internal reflection of the radiation within the guide member. The apparatus is configured to irradiate different portions of the surface by the radiation emitted by relative movement of the surface and/or the outlet. The cleaning unit is an integral part of the immersion lithographic apparatus.

According to another aspect of the invention, there is provided an immersion lithographic apparatus comprising a fluid handling system. The fluid handling system comprises a barrier member and is configured to supply, at least partly confine, and/or remove immersion fluid during exposure of the substrate. The immersion lithographic apparatus also comprises a radiation outlet configured to output radiation for use in a cleaning operation. The radiation outlet is included in the barrier member.

According to another aspect of the invention, there is provided an immersion lithographic apparatus comprising a fluid handling system. The fluid handling system comprises a barrier member and is configured to supply, at least partly confine, and/or remove immersion fluid during exposure of the substrate. The immersion lithographic apparatus also comprises a radiation outlet configured to output radiation for use in a cleaning operation. The radiation outlet is configured to output a beam of radiation with a major cross-sectional dimension smaller than that of a final element of a projection system of the lithographic apparatus.

According to another aspect of the invention, there is provided an immersion lithographic apparatus comprising an optical waveguide member configured to guide, along its length, radiation for use in a cleaning operation. The immersion lithographic apparatus also comprises a fluid handling system comprising a barrier member and a substrate support for supporting a substrate. The barrier member and substrate support each have a surface that may be covered by immersion fluid during exposure of the substrate. The fluid handling system is configured to supply, at least partly confine, and/or remove immersion fluid during exposure of the substrate. A radiation outlet is defined in the surface of the barrier member or the substrate support and is configured to output a radiation beam from the optical waveguide member and direct the radiation beam at a localized portion of the surface of the barrier member or the substrate support.

According to another aspect of the invention, there is provided an immersion lithographic apparatus comprising a liquid handling system that comprises an exposure outlet for outputting a patterned beam of radiation onto a target portion of a substrate during exposure of the substrate. The immersion lithographic apparatus also comprises a barrier member and a substrate support for supporting a substrate. The barrier member and substrate support each have a surface that may be covered by immersion liquid during exposure of the substrate. The liquid handling system is configured to supply, at least partly confine, and/or remove immersion liquid during exposure of the substrate. A cleaning radiation outlet is defined in the surface of the barrier member or the substrate support. The cleaning radiation outlet, being different from the exposure outlet, is configured to output radiation for use in a cleaning operation, and is configured to direct a radiation beam at a localized portion of the surface of the barrier member or the substrate support.

According to another aspect of the invention, there is provided a method of cleaning a lithographic apparatus comprising providing a cleaning fluid to a surface or portion of surface to be cleaned. The method further comprises outputting a beam of radiation to the surface to activate the cleaning fluid. The beam of radiation is output from a radiation outlet. The method further comprises guiding the radiation from a radiation source to the radiation outlet through internal reflection of the radiation within a guide member.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
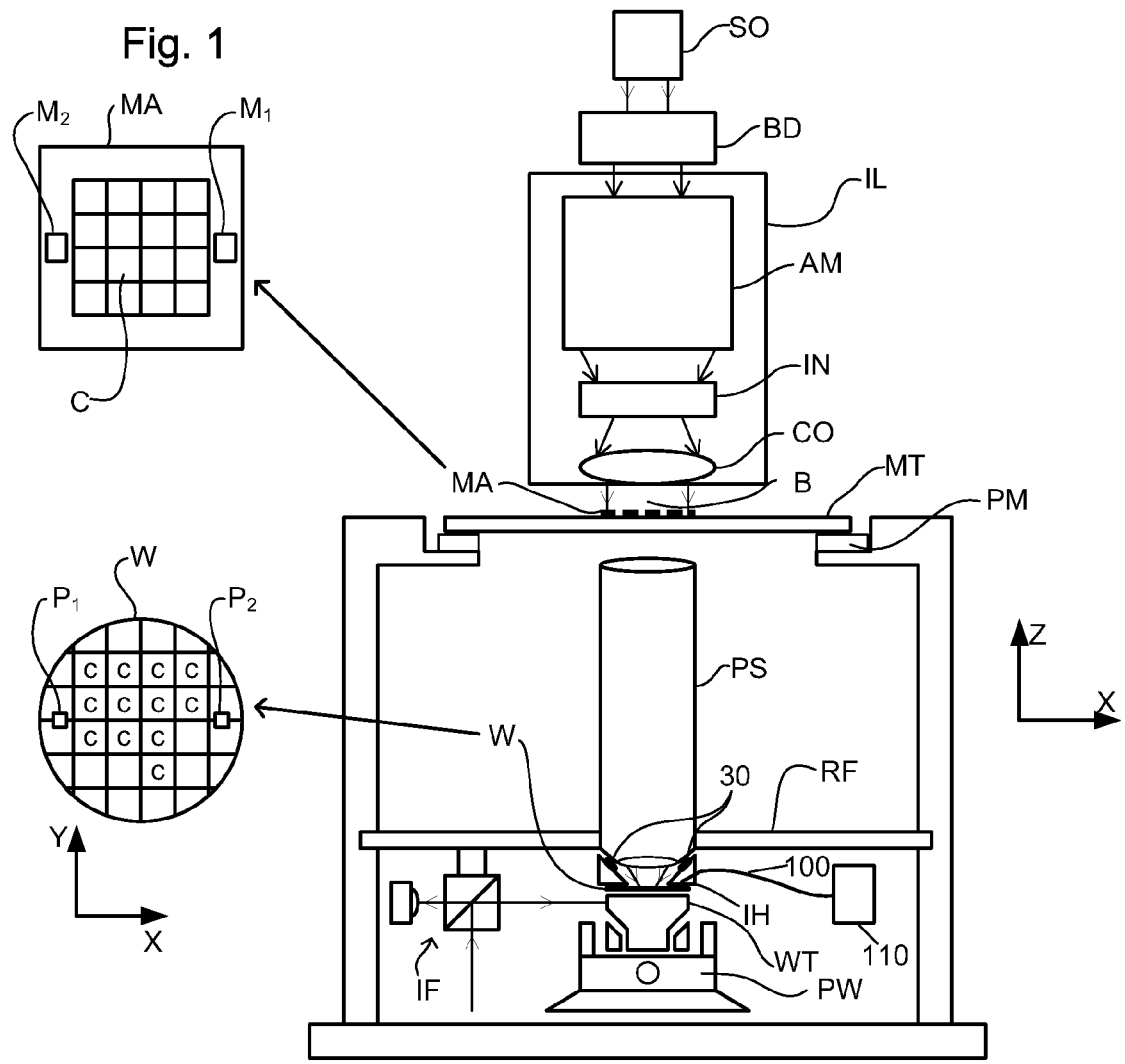
FIG. 1 depicts a lithographic apparatus according to an embodiment of the invention.
Figure 2:
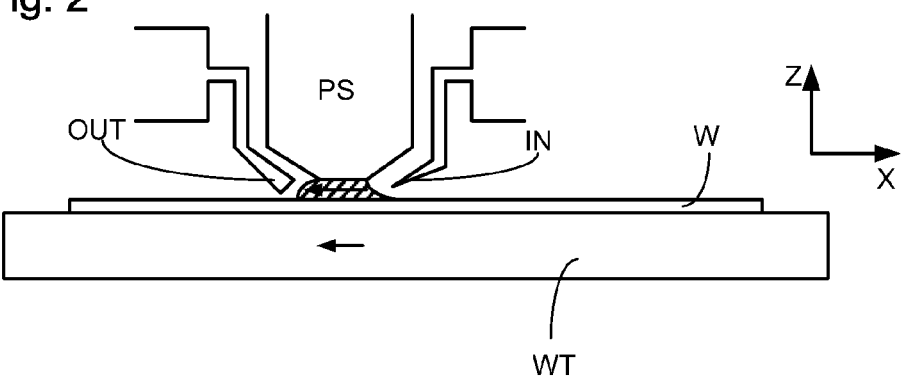
FIGS. 2 and 3 depict a liquid supply system for use in a lithographic projection apparatus.
Figure 3:
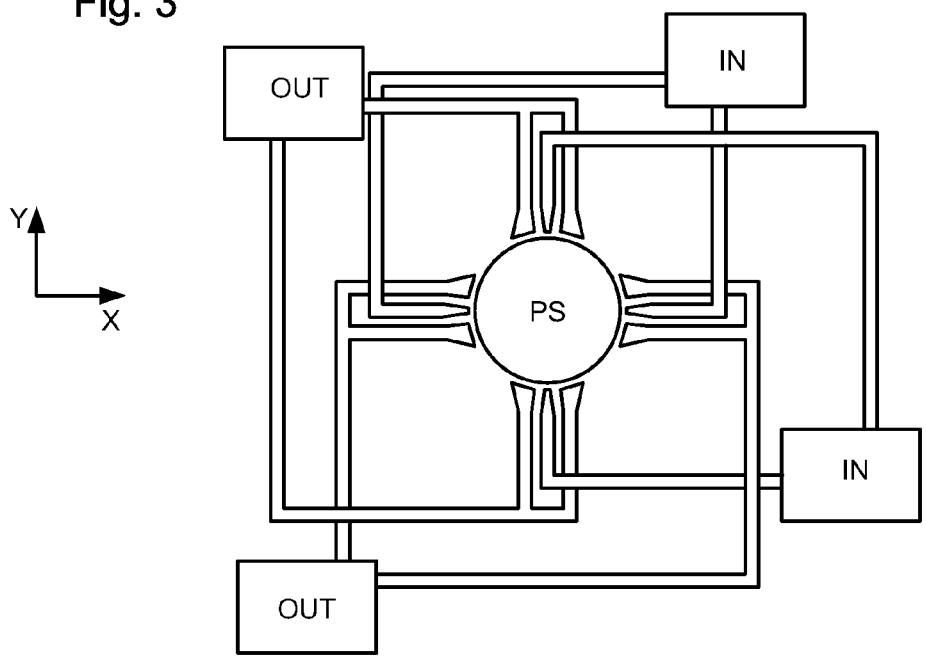

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
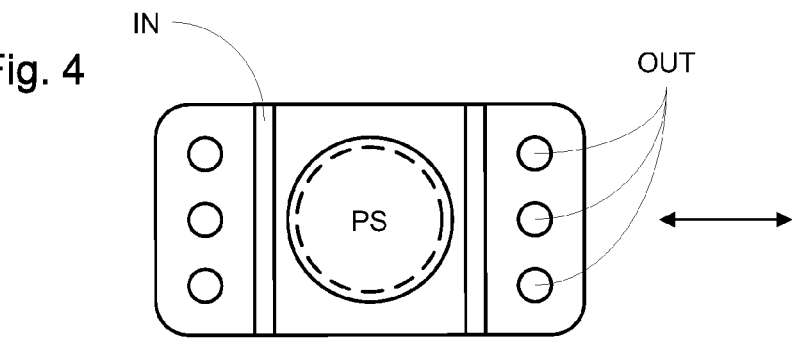
FIG. 4 depicts a further liquid supply system for use in a lithographic projection apparatus.
Figure 4:
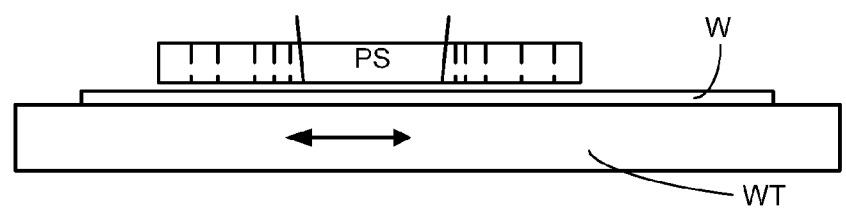

An immersion lithography apparatus with a localized liquid supply system is shown in FIG. 4. Liquid is supplied by two groove inlets IN on either side of the projection system PS and is removed by a plurality of discrete outlets OUT arranged radially outwardly of the inlets IN. The inlets IN and OUT can be arranged in a plate with a hole in its centre and through which the projection beam is projected. Liquid is supplied by one groove inlet IN on one side of the projection system PS. Liquid is removed by a plurality of discrete outlets OUT on the other side of the projection system PS. This causes a flow of a thin film of liquid between the projection system PS and the substrate W. The choice of which combination of inlet IN and outlets OUT to use can depend on the direction of movement of the substrate W (the other combination of inlet IN and outlets OUT being inactive).

Another immersion lithography apparatus with a localized liquid supply system solution which has been proposed provides the liquid supply system with a barrier member (or so-called immersion hood). The barrier member can extend along at least a part of a boundary of the space between the final element of the projection system PS and the substrate table. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such as system with a gas seal is illustrated in FIG. 5.

Figure 5:
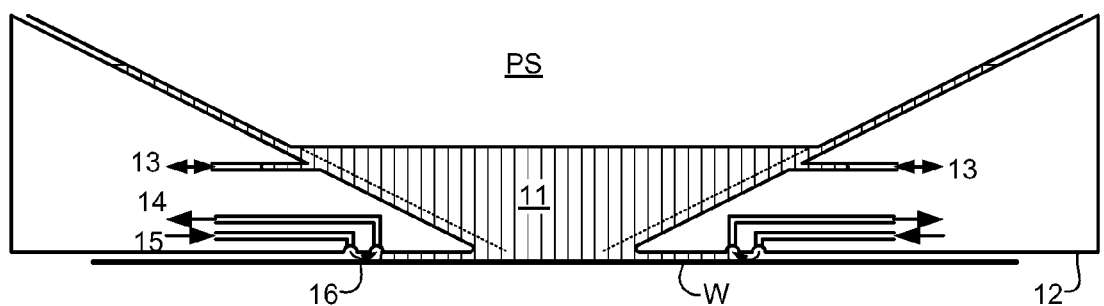
FIG. 5 depicts a further liquid supply system for use in a lithographic projection apparatus.

Referring to FIG. 5, barrier member 12 forms a contactless seal to the substrate around the image field of the projection system. Thus, immersion liquid is confined to fill an immersion space or reservoir 11 between the substrate surface and the final element of the projection system. The reservoir 11 is formed by the barrier member 12 positioned below and surrounding the final element of the projection system PS. Liquid is brought into the space below the projection system and within the barrier member 12 through, for example, port 13. Liquid may be removed from the space 11 be port 13. The barrier member 12 extends a little above the final element of the projection system and the liquid level rises above the final element so that a buffer of liquid is provided. The barrier member 12 has an inner periphery (e.g., inner circumference) that at the upper end, in an embodiment, closely conforms to the shape of the projection system or the final element thereof. It may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air or $N_2$ or another inert gas. In an embodiment, gas is provided under pressure via inlet 15 to the gap between barrier member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in United States patent application publication no. US 2004-0207824.

Figure 6:
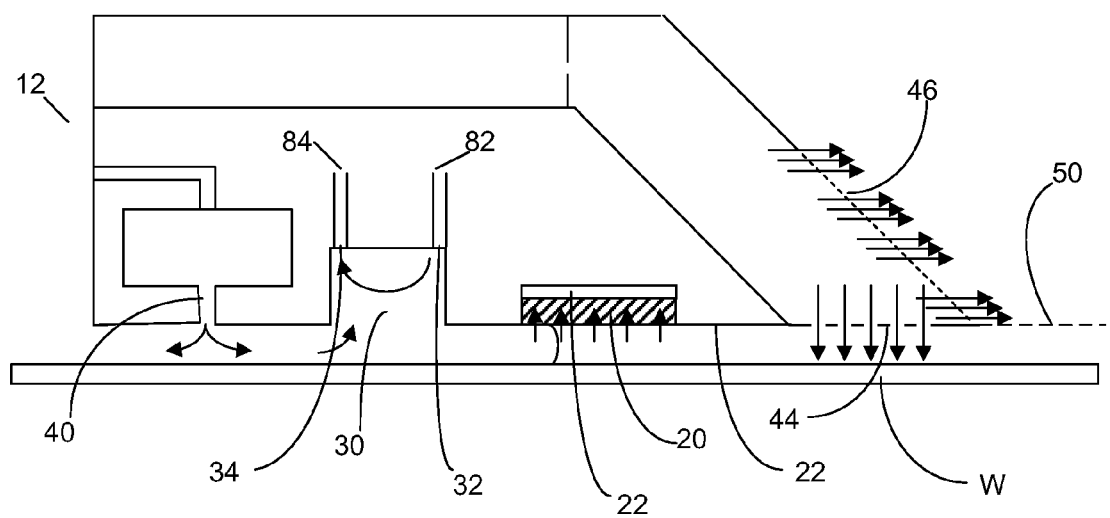
FIG. 6 illustrates, in cross-section, a further liquid supply system.

FIG. 6 illustrates a barrier member 12 which is part of a liquid confinement system IH. The barrier member 12 extends around the periphery (e.g., circumference) of the final element of the projection system PS such that the barrier member (which may be called a seal member) is substantially annular in overall shape.

The function of the barrier member 12 is to maintain and/or contain and/or confine liquid in the space between the projection system PS and the substrate W and/or substrate table WT, i.e. a reservoir 11, so that the projection beam may pass through the liquid. The liquid is at least partly contained in the space by the barrier member 12. The depth of the liquid in the space is maintained by the barrier member 12 so that the liquid does not overflow over the top of the barrier member 12. A seal is provided between the bottom of the barrier member 12 and the substrate W and/or substrate table WT. Features of the seal may constitute at least part of a liquid handling system. The liquid handing system may supply liquid, remove liquid and/or actively confine liquid.

In FIG. 6 the seal is a contactless seal and is made up of several components. Working radially outwardly from the optical axis of the projection system PS, there is provided a (optional) flow control plate 50 which extends into the space (though not into the path of the projection beam). The flow control plate 50 helps maintain parallel flow of the immersion liquid from outlet 46. The direction of the flow may be across the space. At the other side of the space, the liquid exits out through an inlet (not illustrated). The inlet may be at the same level as the outlet 46. This can be so that the immersion liquid flows across the space between the final element of the projection system and the substrate. The flow control plate 50 has through holes in it to help reduce resistance to movement relative to the projection system PS, the substrate W and/or substrate WT in the direction of the optical axis.

Radially outwardly along the bottom of the barrier member 12 there is an inlet 44 which provides a flow of liquid substantially in a direction parallel to the optical axis towards the substrate W and/or substrate table WT. This flow of liquid is used to help fill a gap between the edge of the substrate W and the substrate table WT. If this gap is not filled with liquid, bubbles may be included in the reservoir when an edge of the substrate W crosses the barrier member 12. For example when the edge of the substrate W crosses the seal so that gas and/or liquid flows may be directed towards and/or away from the barrier member 12. This is undesirable as it can lead to deterioration of the image quality.

Radially outwardly of the inlet 44 is an extractor assembly 20 configured to extract liquid from between the barrier member 12 and the substrate W and/or substrate table WT. The extractor assembly 20 will be described in more detail below and forms part of the contactless seal which is created between the barrier member 12 and the substrate W and/or substrate table WT.

Radially outwardly of the extractor assembly is a recess 30. The recess 30 may be connected through an inlet 82 to the atmosphere. The recess 30 may be connected via an outlet 84 to a low pressure source. Radially outwardly of the recess 30 is a gas life 40. An arrangement of the extractor, recess and gas knife is disclosed in detail in United States patent application publication no. US 2006-0158627. However, in that document the arrangement of the extractor assembly 20 is different.

The extractor assembly 20 is comprised of a liquid removal device or extractor or outlet such as the one disclosed in United States patent application no. US 2006-0038968. Any type of liquid extractor can be used. In an embodiment, the liquid extractor comprises an outlet which is covered with a porous material. The porous material is used to separate liquid from gas to enable single-liquid phase liquid extraction. The inlet may be ring shaped, around the optical axis. Desirably the inlet may be annular; it may be continuous or discontinuous. A chamber 22 downstream of the porous material is maintained at a slight under pressure and is filled with liquid. The under pressure in the chamber 22 is such that meniscuses are formed in the holes of the porous material. The meniscuses prevent ambient air or gas being drawn into the chamber 22 of the liquid extractor 20. However, when the porous surface comes into contact with liquid there is no meniscus to restrict flow and the liquid can flow freely into the chamber 22 of the liquid extractor 20. The porous surface extends radially inwardly along the barrier member 12 (as well as around the space). The rate of extraction of the extraction assembly 20 varies according to how much of the porous material is covered by liquid.

The apparatus of an embodiment of the present invention comprises an immersion lithographic apparatus with a liquid handling system. Any suitable liquid handling system can be used, such as those described above.

Figure 7:
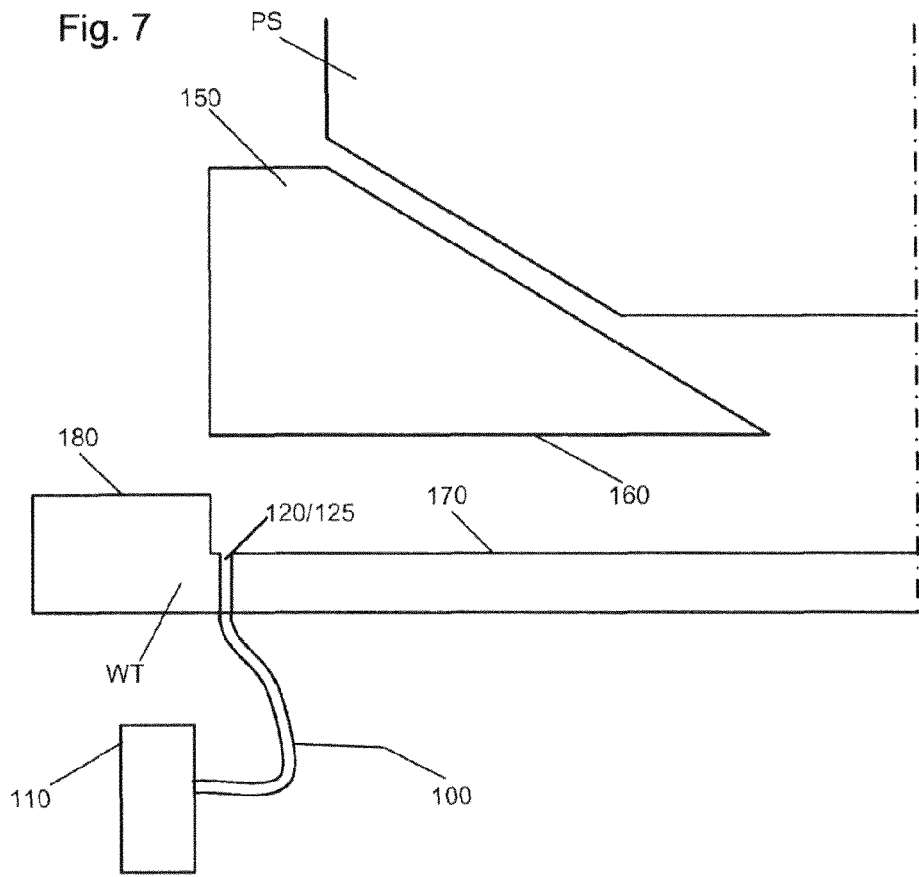
FIG. 7 depicts a cross sectional view of an example barrier member, substrate table, and cleaning apparatus according to an embodiment of the present invention.
Figure 8:
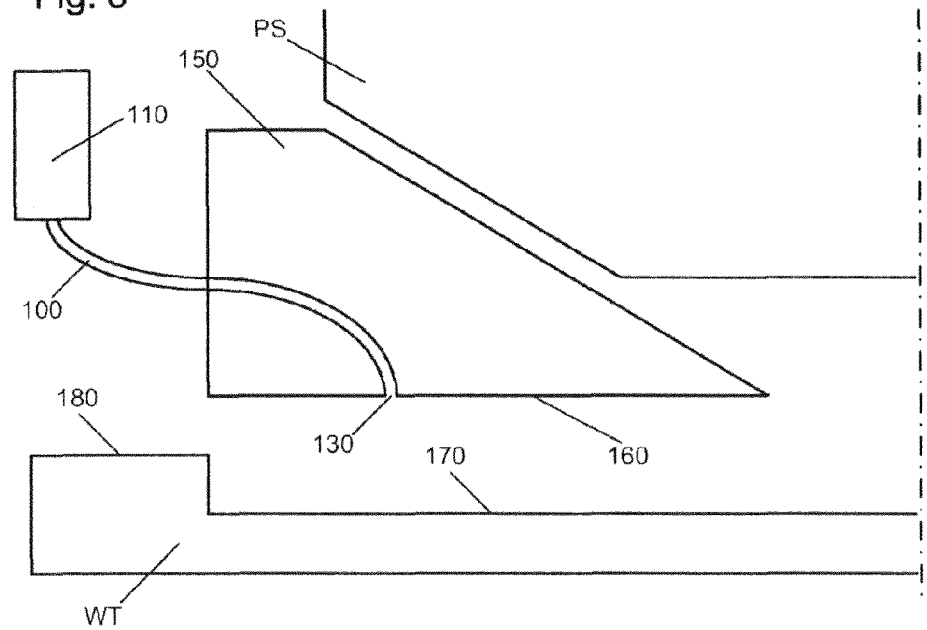
FIG. 8 depicts a cross sectional view of an example barrier member, substrate table, and cleaning apparatus according to a further embodiment of the present invention.

As illustrated in the embodiments of FIG. 7 and FIG. 8, within the immersion lithographic apparatus there is an immersion space. The immersion space is defined by a barrier member 150, the final element of the projection system PS and the substrate table WT and/or the substrate W (when present). Surfaces of the immersion space may become contaminated. This can be through, for example, evaporation of immersion liquid. The immersion liquid may comprise contaminants. Evaporation can cause the formation of a contaminating deposit. In particular, the barrier member 150 and substrate table WT are particularly susceptible to a build up of contamination if the contamination is not removed promptly. Indeed, any surface of the immersion system that is exposed to immersion liquid is particularly susceptible to contamination. Cleaning of these surfaces is desired in order to help prevent build up of contamination beyond an acceptable level.

Current cleaning methods may involve the use of a highly oxidizing cleaning material. Examples of currently used cleaning materials include ozone, hydrogen peroxide, perozone and an organic solvent. As such, these cleaning materials (e.g. ozone and hydrogen peroxide) may be used in solution as a cleaning fluid. The cleaning fluid may be used to clean surfaces which may contact immersion liquid. The cleaning materials may have one or more problems associated with them. For example, there is a risk of damage to component surfaces, such as if the concentration of ozone and/or hydrogen peroxide in the cleaning fluid is above a certain level. Cleaning material may require careful handling in order to reduce the potential risk of injury. The cleaning material may leave deposits on the surfaces to which it is exposed. Deposition of such deposits may be called staining. The staining can be worse if a solution with a cleaning agent above a certain concentration is used. The deposits may need to be removed before the apparatus can be used. The stains may prevent the apparatus from functioning properly. Rinsing to remove these deposits should be thorough. Rinsing therefore may take significant time. This may be a particular problem when using an organic cleaning solvent which is not easily removed by rinsing with water.

It is therefore desirable to reduce the use of such cleaning agents.

Electromagnetic radiation, desirably an ultraviolet (UV) radiation, may be used to activate certain cleaning fluids, such as hydrogen peroxide and ozone. This can result in the generation of more reactive hydroxyl radicals which have additional cleaning effect and/or oxidising properties. This can allow, for example, a lower concentration of cleaning agent to be used, thereby reducing one or more of the problems discussed above. However, in a typical lithographic apparatus, there is limited space. There may be insufficient space in close proximity to the surfaces that require cleaning (such as a barrier member of a liquid handling system, or the substrate table) to provide direct illumination by a UV radiation source suitable to activating such a cleaning agent in situ. Thus, in current systems, a UV radiation source is provided specifically for a cleaning operation. However, space may be sufficiently limited that it is difficult to provide a suitable UV illumination, even from a specific source in situ. The lithographic apparatus may have to be at least partially dismantled to perform the cleaning operation. Such a cleaning operation can therefore not be performed in-line.

As outlined above, typically there is insufficient space in the immersion lithographic apparatus in the vicinity of the surfaces that require cleaning to incorporate an ultraviolet radiation source. Thus, conventionally, the immersion lithographic apparatus has to be taken off-line in order to use ultraviolet radiation in a cleaning process.

A UV radiation source is a source of heat as a well as a source of UV radiation. During in-line operation, the UV radiation source may output heat. If the UV radiation source is in close proximity to the apparatus, such as the immersion system, heat would be transferred to the apparatus. Some components of the apparatus, such as a sensor and/or a coating on the substrate table, are heat sensitive and may be damaged by excessive heat. The substrate is heat sensitive. Therefore, it is undesirable for the radiation source to be located close to the immersion system, or even within the apparatus.

The apparatus of an embodiment of the present invention enables electromagnetic radiation (such as UV radiation) to be used during in-line cleaning of the surfaces of an immersion system. According to an embodiment of the present invention shown in FIG. 7, there is provided a radiation source 110, such as an ultraviolet radiation source. The radiation source 110 is not located at the position where the radiation is required. Such a radiation source 110 may be referred to herein as a remote radiation source 110. As shown in FIG. 7, ultraviolet radiation produced by the remote ultraviolet radiation source 110 can be transported to an outlet 120. At the outlet 120, the ultraviolet radiation is used in a cleaning process. The ultraviolet radiation is guided to the outlet 120 via a radiation guide member 100 or (electromagnetic) waveguide. The guide member 100 guides radiation by way of internal reflection. The internal reflection may be total internal reflection, or substantially total internal reflection. As such, guide member 100 is able to transfer or direct electromagnetic radiation (such as ultraviolet radiation) from a radiation source 110 to a radiation outlet 120.

According to an embodiment, ultraviolet radiation is used in conjunction with a cleaning fluid in a cleaning process. Examples of cleaning fluids are solutions containing hydrogen peroxide and/or ozone. The cleaning fluid may be provided to the surface or part of surface being cleaned using any suitable method. For example, a supply system could be used. Such a supply system could provide a cleaning fluid to at least a part of a space or gap between the radiation outlet 120 and the surface being cleaned.

Reference to ultraviolet radiation as used herein can mean any appropriate electromagnetic radiation. Similarly, reference to an ultraviolet radiation source as used herein can mean any appropriate electromagnetic radiation source.

Using the apparatus according to an embodiment of the present invention, the ultraviolet radiation source 110 can be incorporated into an immersion lithographic device. This means that cleaning can take place in-line. As such, the apparatus does not need to be dismantled in order to use ultraviolet radiation in a cleaning operation. This means that in-line cleaning can take place using the apparatus of the present invention within approximately one hour.

As explained above, by using the radiation guide member (which may be simply referred to as a guide member) 100 to direct ultraviolet radiation from an ultraviolet radiation source 110 to a radiation outlet 120, the ultraviolet radiation source 110 can be located at any given position on or outside the lithographic apparatus. The ultraviolet radiation source 110 may be an integral part of the lithographic apparatus. In some embodiments, the ultraviolet radiation source 110 is permanently located within the immersion lithographic apparatus. In an embodiment, the ultraviolet radiation source could be separable, or provided separately, from the immersion lithographic apparatus. However, in all embodiments, it is possible to use electromagnetic radiation in an in-line cleaning process.

According to the embodiments shown in FIGS. 7 and 8, a guide member 100 is used to direct the ultraviolet radiation from the radiation source 110 to the radiation outlet 120. The guide member 100 may be a waveguide, for example an optical waveguide. The guide member 100 can be flexible. As such, it can be bent, rotated, translated and/or twisted in order to adopt a desired shape. The guide member may be contorted or manipulated in a manner of an optic fiber. Typically, the guide member can bend in a radius at least as small as 4 cm. The guide member 100 is constructed such that, however it is manipulated, it is still able to direct ultraviolet radiation from the ultraviolet radiation source 110 to the radiation outlet 120. The guide member is flexible, facilitating its manipulation. The guide member 100 may be resilient and durable. Between some features of the apparatus, such as the substrate table WT and barrier member, relative motion may reach 1 meter per second. The physical properties of the guide member 100 enable it to withstand such motions without damage.

Typically, an optical fiber is used as a guide member 100. In an embodiment, a bundle of optical fibers can be used as a guide member 100. The optical fiber(s) can be at least one meter in length, and still transmit a sufficient portion of radiation from radiation source 110 to radiation outlet 120. Typically, the diameter of the optical fiber or bundle of optical fibers is between 0.1 mm and 3 mm. The diameter of the optical fiber or bundle of optical fibers could be between 0.2 mm and 2 mm. The diameter of the optical fiber or bundle of optical fibers could be 1 mm. It may be possible to use optical fibers or bundles of optical fibers with a larger diameter (such as, for example, 5 mm), although these may not have sufficient flexibility. It may also be possible to use optical fibers or bundles of optical fibers with a diameter of less than 0.1 mm (such as, for example, 0.01 mm), although the area of the emitted radiation may then be smaller than desired for a suitable cleaning time, and/or may not be of sufficient power. As referred to herein, the diameter of the optical fiber or bundle of optical fibers could be the internal diameter or the external diameter of the optical fiber or bundle of optical fibers. The fiber(s) need not be round and as such references to the diameter may be considered more generally as a major cross-sectional dimension (e.g., width).

A suitable optical fiber for use with the electromagnetic radiation used in the cleaning process of an embodiment the present invention comprises a fluoride doped silica. Thus, fluoride doped silica glass fibers according to an embodiment of the present invention may transmit ultraviolet radiation from the ultraviolet radiation source 110 to the outlet 120. Further types of optical fiber that could be used are Ceramoptec and/or Optran fibers.

The wavelength of the ultraviolet radiation used with the apparatus of an embodiment of the present invention can be adapted to suit the particular cleaning agent being used. Generally the wavelength of the radiation would be in the range of 100 nm to 400 nm. More typically, the wavelength of the radiation would be in the range of 150 nm to 300 nm. If hydrogen peroxide were used in the cleaning fluid, then radiation with wavelength in the range 200 nm to 250 nm would desirably be used to activate the hydrogen peroxide for cleaning. More specifically, radiation with a wavelength of 220 nm could be used in order to activate the hydrogen peroxide cleaning agent. If ozone were to be used as part of a cleaning fluid, then radiation with wavelength between 170 nm and 200 nm would desirably be used in order to activate the ozone. More specifically, radiation with a wavelength of 185 nm could be used in order to activate the ozone for cleaning. In order to prevent excess ozone from building up, radiation with a wavelength that causes it to be activated (such as, for example, 185 nm) could be used in combination with radiation of a wavelength that breaks down ozone (such as, for example, 254 nm). For example, the radiation could be a 5% proportion of radiation with wavelength 185 nm and a 95% proportion of radiation with a wavelength of 254 nm. Another way of limiting the formation of excess ozone is to use radiation with a wavelength of less than 200 nm in combination with a cleaning fluid (or gas mixture) having a low oxygen content (for example 0-1000 ppm oxygen).

As described herein, a wet oxidant, such as hydrogen peroxide, ozone and/or a solution containing dissolved oxygen may be used as a cleaning fluid for use with apparatus according to an embodiment of the present invention. Alternatively, the apparatus of an embodiment of the present invention could be used in a "dry" oxidation process. In such a "dry" oxidation process, radiation may be applied to a gas comprising oxygen (such as, for example, standard air) in the cleaning process.

The intensity of the radiation provided at the outlet 120 is typically selected from between 10 mW/cm$^2$ and 1000 mW/cm$^2$. A higher intensity of radiation may lead to faster generation of oxidizing particles. As such, this may lead to faster cleaning. However, with faster cleaning there may be an increased risk of damage to the surface being cleaned.

Any suitable source for providing the radiation could be used as radiation source 110. For example, a simple UV lamp could be used. Alternatively, a xenon flash lamp could be used. Alternatively still, a low pressure mercury lamp, or a mid pressure or high pressure mercury lamp, could be used. A lens could also be used in order to increase the intensity of the radiation beam. This may be particularly appropriate in the case of a low pressure mercury lamp. A xenon flash lamp could enable faster oxidation rates. In this regard, the radiation emitted by a xenon flash lamp can be, for example, 400 times greater in intensity than the radiation of a low pressure mercury lamp. Further possible radiation sources include a laser (for example a 193 nm or 224 nm laser), and a xenon excimer lamp (emitting 172 nm radiation, for example).

As explained above, a guide member 100 is used in the embodiments of FIGS. 7 and 8 of the present invention to transfer electromagnetic radiation from radiation source 110 to outlet 120. The outlet 120 can be provided at any suitable location. Typically, the outlet is provided at a location that is substantially opposite to the surface or part of surface that is to be cleaned. In other words, the outlet is typically situated so as to be substantially facing the surface or part of surface to be cleaned.

In FIG. 7, the outlet 120 is provided in the substrate table WT. As such, the radiation is transferred from radiation source 110, via guide member 100, and out through outlet 120. The outlet 120 faces barrier member 150. As such, the radiation provided from outlet 120 in FIG. 7 can be used in, for example, cleaning of the surface 160 of barrier member 150 that faces substrate table WT.

A specific, non-limiting example of an opening that could be used to provide an outlet 120 in the substrate table WT is a drain inlet 125. The drain inlet is an exit path for immersion liquid that enters a gap between the peripheral edge of the substrate W and an edge of the substrate table WT during exposure of the substrate. This area may be referred to as a bubble extraction system.

Alternatively or additionally, a sensor location (desirably in an unused sensor location) could be used to form a radiation outlet. The sensor location may be on an upper surface of the substrate table WT. A seal between an upper surface of a substrate table and a sensor could be used as a radiation outlet 120. This could be achieved by, for example, providing a seal that transmits radiation (for example UV radiation). The seal between the upper surface of the substrate table and the sensor may be referred to as a sticker position.

In the embodiment shown in FIG. 8, a radiation outlet 130 is positioned in the lower surface 160 of the barrier member 150. The outlet 130 has the same function and properties as the radiation outlet 120 described herein. As used herein, the term barrier member can be taken to exclude elements of the projection system PS. Radiation can be directed from radiation outlet 130 to a surface 170 of the substrate table WT that faces the barrier member 150. This surface 170 is a surface that could support a substrate W during exposure. The surface 170 may be referred to as a substrate holder or a burl table. (Note cleaning occurs without the presence of the substrate W on the surface 170). By moving the substrate table WT relative to the barrier member 150 (as described below) the radiation provided at outlet 130 can also be directed onto the surface 180 of the substrate table WT. The surface 180 is raised above the substrate holder surface 170. The surface 180 would typically not support the substrate W during exposure. However, immersion liquid may be on the surface 180 during exposure of the substrate W.

Typically, an opening in the immersion lithographic apparatus that already exists for some other purpose is used as a radiation outlet (although this need not be the case). For example, the radiation outlet 120, 130 could be located at an opening that forms part of a liquid handling system for immersion liquid. For example, such an opening could be a passage that contains immersion liquid during exposure of the substrate WT, such as an immersion liquid inlet, or an immersion liquid outlet.

A specific, non-limiting example of an outlet 130 that could be used as a radiation outlet in the barrier member 150 is a gas knife outlet. For example, this could be the gas knife outlet 40 described above with reference to FIG. 6.

A further example of an existing opening that could be used as radiation outlet 130 in barrier member 150 is the inlet 82, outlet 84 or through the porous member assembly 20.

According to an embodiment, a radiation outlet 120, 130 is provided radially inwardly of features of the gas seal in the barrier member 12. For example, a radiation outlet could be provided radially inwardly of a gas knife, such as the gas knife 40 shown in FIG. 6.

According to an embodiment of the invention, at least a part of guide member 100 is threaded through an outlet (or aperture) and/or a passageway in an immersion lithographic apparatus before the cleaning operation commences. Thus, according to this embodiment, the radiation source 110 can be permanently in position. The radiation outlet(s) 120, 130 may also be permanently in position and/or be an integral part of the immersion lithography apparatus. However, the guide member 100 may only be located at an outlet 120, 130 and connected to the radiation source 110 during the cleaning operation (or during the preparation therefor). In an embodiment, the guide member 100 can be permanently connected to the radiation source 110.

In an embodiment, just one guide member 100 is provided. This guide member 100 can be passed through a different outlet and/or passageway as required in order to output the radiation from radiation source 110 to different locations, as required. For example, the guide member 100 could be situated so as to cause radiation to be output from one radiation outlet 120, 130 at a particular time during the cleaning operation. The guide member 100 may be moved to output radiation from a different outlet 120, 130 at a different time during the cleaning operation.

Alternatively, more than one guide member 100 can be provided. One guide member 100 may direct radiation from the radiation source 110 to one outlet 120, 130. Another guide member 100 may direct radiation from the radiation source 110 to another outlet. In an embodiment, more than one radiation source 110 can be provided. Each radiation source 110 can have one or more associated guide members 100.

In an embodiment, one or more dedicated passageways and/or outlets can be provided in the immersion lithographic apparatus for the guide member 100. For example, a dedicated passageway and/or outlet could be provided in the barrier member 150 and/or the substrate table WT. The dedicated passageway and/or outlet could serve no other purpose, for example during exposure of a substrate W.

Dedicated outlets for the radiation may also be provided in alternative embodiments. In an embodiment that has a dedicated passageway, aperture and/or outlet for the radiation, the guide member(s) can be permanently located in position, even during exposure of a substrate W.

The radiation provided by the outlet 120, 130 may be substantially circular in cross-section. The radiation may be provided by the outlet 120, 130 in a different shape than circular. Desirably, no significant diffusion or divergence of the radiation occurs between the outlet 120, 130 and the surface on which the radiation falls i.e. the surface that the radiation is used to clean. In an embodiment, the outlet 120, 130 is configured to output a beam of radiation with a major cross-sectional dimension (e.g., width or diameter) smaller than that of a final element of a projection system of the lithographic apparatus. In an embodiment, the diameter of the substantially circular radiation beam is selected from the range of 10 microns to 5 mm. In an embodiment, the diameter of the radiation beam is selected from the range of 0.1 mm to 2 mm. As such, the beam of radiation irradiates only in a relatively small portion, for example less than one percent, of the surface which it is being used to clean.

Figure 9:
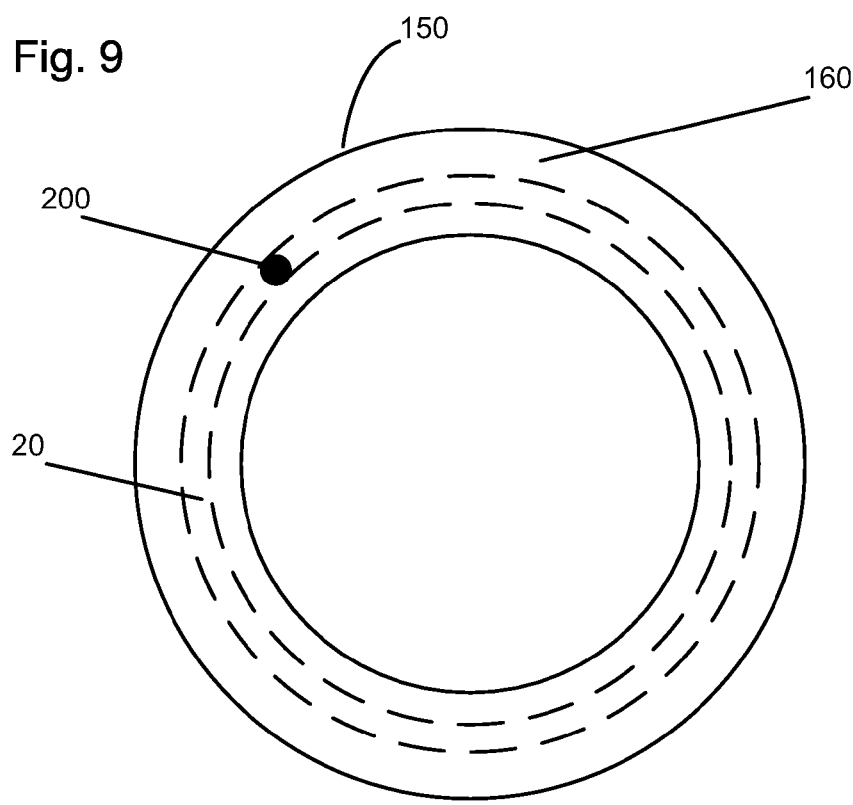
FIG. 9 depicts a plan view of a barrier member showing an example of an area that could be irradiated using the apparatus of an embodiment of the present invention.

An example of a portion 200 of the lower surface 160 of barrier member 150 that is being irradiated is shown in FIG. 9. The portion 200 of the lower surface 160 could be created by radiation exiting from outlet 120 in substrate table WT. Because the area (or spot) of the surface 160 that is being irradiated at any given time is only a small proportion of the entire surface, it is desirable to have a high intensity radiation beam (for example 1 W/cm$^2$) in order to speed up the oxidation and thus the cleaning operation. The location of the portion 200 of the surface 160 that is irradiated by the radiation provided by radiation source 110 can be changed by movement of the surface being irradiated relative to the radiation outlet and/or by movement of the outlet 120 relative to the surface being irradiated. In the example shown in FIG. 9, the relative motion is achieved by movement of the substrate table WT. The movement causes the outlet 120 to move relative to surface 160. Thus the location of irradiated portion 200 of surface 160 can move. In this way all of the surface 160 may be cleaned when the surface is irradiated by UV radiation in the presence of a cleaning fluid. However such cleaning may take a long time because of the small area exposed to the UV radiation from the guide member 100.

Exposing a small area may be desirable to clean specific features or areas of features which may be difficult to clean or may require specific attention. By restricting the UV radiation to the area required to be cleaned, the radiation is directed to a defined area so that the surrounding surface may not be damaged, for example oxidized. The radiation is so restricted to achieve localized cleaning. Localized cleaning may be facilitated by combining the small exposure area with, for example, precise relative movement of the substrate table WT. The intensity of the radiation directed at the area is maximized, ensuring fast cleaning. The intensity of the radiation may be as much as 1 W/cm$^2$. Since the guide member has a small width and is flexible it can be mounted on several places of the lithographic apparatus, such as described herein. Different surfaces of the apparatus may be cleaned.

A surface which may be cleaned using an embodiment of the present invention includes the different features of the contactless seal on the under surface 160 of the barrier member 150, 12. For example, the porous material of the extractor assembly 20 may be contaminated. Such contaminants are organic particles. The organic particles may make the surface which is normally lyophilic become lyophobic, preventing the extractor assembly from working effectively. In use, gas may be incorporated through the assembly 20 so the extractor becomes less effective. Organic contaminants may be readily removed from the porous member by cleaning fluid, e.g. a solution of ozone and/or peroxide, in the presence of UV radiation. As the area of the member is specific, the whole or a part of the surface of the porous member may be cleaned, using an embodiment of the present invention. UV radiation is directed at the specific portions of the surface desired to be cleaned.

The cleaning process may occur in-line. Thus cleaning may be achieved with minimal downtime, without necessarily cleaning the whole immersion system with an active cleaning fluid. Thus the risk of damage to a surface of the immersion system, which may be sensitive to the cleaning fluid, is reduced.

Figure 10:
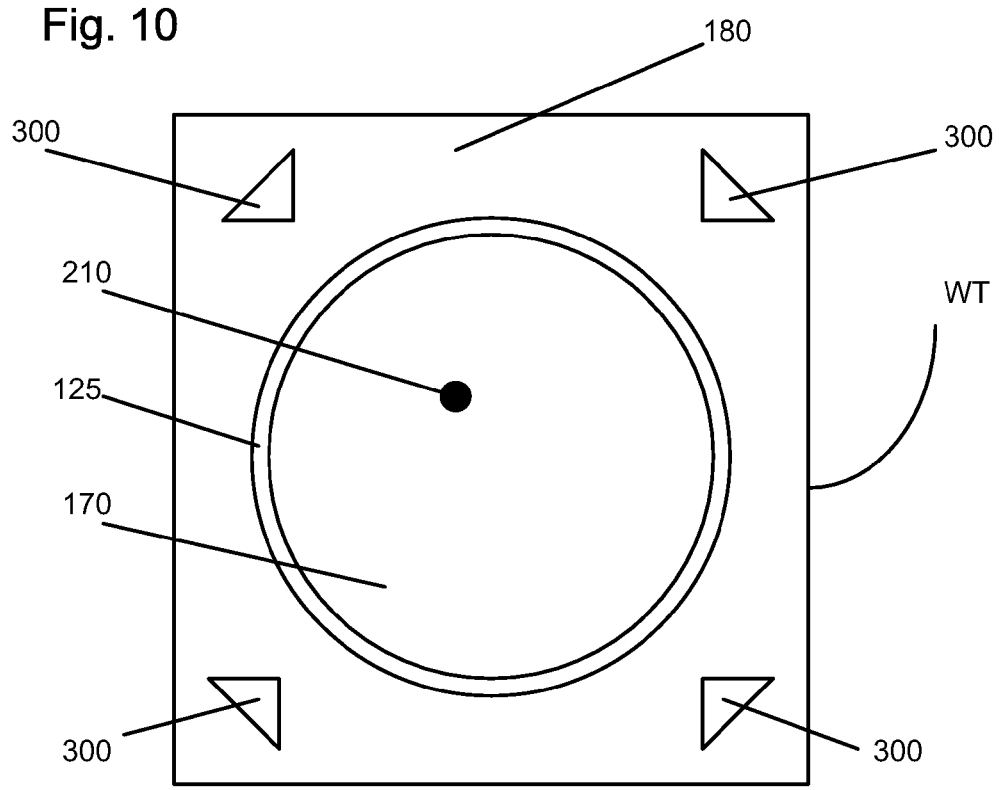
FIG. 10 depicts a plan view of a substrate table and sensors together showing an example of an area that could be irradiated using the apparatus of an embodiment of the present invention.

FIG. 10 shows a portion 210 of a substrate table WT. The portion 210 could be illuminated, for example, by radiation from outlet 130 in barrier member 150. The location of irradiated portion 210 can be varied by movement of the surface 170,180 of the substrate table WT relative to the outlet 130 and/or movement of the outlet 130 relative to the surface 170,180 of the substrate table WT. As shown in FIG. 10, through this relative movement, the portion 210 of the surface 170, 180 exposed to the UV radiation changes so that the exposed portions are cleaned. Such portions include drain inlet 125 and the surface of the substrate holder 170, for example near the inlet 125. The surrounding surface 180 of the substrate table WT, which faces the barrier member 150, may be exposed for cleaning by this relative movement. Sensors 300 could be cleaned using the method and apparatus of an embodiment of the present invention. Such a sensor may be located on the substrate table WT and could be, for example, a transmission image sensor (TIS), an integrated lens inferometer at scanner sensor (ILIAS) and/or a spot sensor. It is desirable that specific features are cleaned using an embodiment of the present invention to help minimize downtime.

In different embodiments, different, or alternative, radiation outlets could be used to provide radiation to the part 170 of the substrate table WT that supports the substrate W during exposure, and/or the surrounding upper surface 180 which faces the barrier member 150, and/or the sensors 300.

In an embodiment, there is provided an immersion lithographic apparatus comprising: a fluid handling system comprising a barrier member and configured to supply, at least partly confine, and/or remove immersion fluid during exposure of the substrate; and a radiation outlet configured to output radiation for use in a cleaning operation, the radiation outlet being included in the barrier member. In an embodiment, the apparatus further comprises a radiation source configured to provide radiation for output by the radiation outlet during the cleaning operation. In an embodiment, the apparatus further comprises a guide member configured to guide radiation from the radiation source to the radiation outlet through internal reflection of the radiation within the guide member. In embodiment, the radiation outlet is located at a position that enables radiation to be directed, during the cleaning operation, at a portion of a substrate table configured to support a substrate and/or a drain inlet located adjacent the portion. In an embodiment, the radiation outlet is configured to direct radiation at a surface that faces towards the barrier member during the cleaning operation. In an embodiment, the apparatus further comprises a sensor, wherein the radiation outlet is configured to direct radiation at a surface of a sensor during the cleaning operation. In an embodiment, the apparatus is configured to irradiate different portions of a surface with the radiation by relative movement between the surface and/or the radiation outlet.

In an embodiment, there is provided an immersion lithographic apparatus comprising: a fluid handling system comprising a barrier member and configured to supply, at least partly confine, and/or remove immersion fluid during exposure of the substrate; and a radiation outlet configured to output radiation for use in a cleaning operation, the radiation outlet configured to output a beam of radiation with a major cross-sectional dimension smaller than that of a final element of a projection system of the lithographic apparatus. In an embodiment, the apparatus is arranged such that the beam of radiation can irradiate a portion of a surface to be cleaned during the cleaning operation. In an embodiment, the portion of the surface that is irradiated during the cleaning operation has a major cross-sectional dimension of between 0.1 mm and 2 mm. In an embodiment, the beam of radiation has a major cross-sectional dimension of less than 2 mm at the radiation outlet position. In an embodiment, the apparatus further comprises a radiation source configured to provide radiation to be output by the radiation outlet during the cleaning operation, and a guide member configured to transfer the radiation from the radiation source to the radiation outlet through internal reflection of the radiation within the guide member during the cleaning operation. In an embodiment, the guide member is a bundle of optical fibers. In an embodiment, the radiation beam is directed at a portion of a surface of the fluid handling system. In an embodiment, the portion is part of: a drain inlet, a gas knife, an extractor outlet, a gas inlet or outlet, a liquid inlet or outlet, or a flow control plate.

In an embodiment, there is provided a method of cleaning a lithographic apparatus comprising: providing a cleaning fluid to a surface or portion of surface to be cleaned; outputting a beam of radiation to the surface to activate the cleaning fluid, wherein the beam of radiation is output from a radiation outlet; and guiding the radiation from a radiation source to the radiation outlet through internal reflection of the radiation within a guide member. In an embodiment, the cleaning agent is provided at a concentration without causing damage to the surface on which it is provided. In an embodiment, the cleaning agent is hydrogen peroxide and/or ozone. In an embodiment, the guide member is a bundle of at least two optical fibers, the bundle having a width of between 0.1 mm and 2 mm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a movable table;
   an exposure outlet configured to output a patterned beam of radiation onto a target portion of a substrate during exposure of the substrate;
   a fluid handling system comprising a barrier member above the table, and configured to supply, at least partly confine, and/or remove immersion fluid during exposure of the substrate; and
   a radiation outlet configured to output radiation for use in a cleaning operation, the radiation outlet being included in the barrier member and being different from the exposure outlet.

2. The immersion lithographic apparatus according to claim 1, further comprising a guide member configured to guide radiation to the radiation outlet through internal reflection of radiation within the guide member.

3. The immersion lithographic apparatus according to claim 1, configured to output the radiation beam from the radiation outlet onto a surface of a sensor.

4. The immersion lithographic apparatus according to claim 1, further comprising a further radiation outlet configured to direct radiation at a portion of a surface to be cleaned.

5. The immersion lithographic apparatus according to claim 4, wherein the radiation is output interchangeably from the cleaning radiation outlet or the further radiation outlet.

6. The immersion lithographic apparatus according to claim 1, wherein the radiation outlet is configured to output the radiation beam with a major cross-sectional dimension smaller than that of a final element of a projection system of the immersion lithographic apparatus.

7. The immersion lithographic apparatus according to claim 1, wherein the radiation beam is configured to react with hydrogen peroxide to produce a hydroxide ion or a hydroxyl radical during the cleaning operation.

8. The immersion lithographic apparatus according to claim 1, further comprising a cleaning solution supplier configured to supply a cleaning fluid between the radiation outlet and a surface to be cleaned.

9. The immersion lithographic apparatus according to claim 1, wherein, during the cleaning operation, the radiation outlet is within:
   the opening configured to house at least part of the sensor;
   the passage that can contain the fluid; or the seal between the upper surface of the substrate table and at least part of the sensor.

10. An immersion lithographic apparatus comprising:
an exposure outlet configured to output a patterned beam of radiation onto a target portion of a substrate during exposure of the substrate;
an optical waveguide member configured to guide, along its length, radiation for use in a cleaning operation; and
a fluid handling system comprising a substrate support configured to support the substrate and a barrier member above the substrate support, the barrier member and substrate support each having a surface that may be covered by immersion fluid during exposure of the substrate, the fluid handling system being configured to supply, at least partly confine, and/or remove immersion fluid during exposure of the substrate,
wherein a radiation outlet, being different from the exposure outlet, is defined in the barrier member, is, during the cleaning operation, within an opening configured to house at least part of a sensor, is, during the cleaning operation, within a passage in a movable table that can contain fluid, or is, during the cleaning operation, within a seal between an upper surface of a substrate table and at least part of the sensor, and the radiation outlet is configured to output a radiation beam from the optical waveguide member and direct the radiation beam at a localized portion of the immersion lithographic apparatus.

11. The immersion lithographic apparatus according to claim 10, wherein the radiation outlet is in the barrier member.

12. The immersion lithographic apparatus according to claim 10, wherein the localized portion is a surface of a sensor.

13. The immersion lithographic apparatus according to claim 10, further comprising a further radiation outlet configured to direct radiation at a portion of a surface to be cleaned.

14. The immersion lithographic apparatus according to claim 10, wherein the radiation outlet is configured to output a beam of radiation with a major cross-sectional dimension smaller than that of a final element of a projection system of the immersion lithographic apparatus.

15. The immersion lithographic apparatus according to claim 10, wherein the radiation beam is configured to react with hydrogen peroxide to produce a hydroxide ion or a hydroxyl radical during the cleaning operation.

16. The immersion lithographic apparatus according to claim 10, wherein the waveguide member is flexible.

17. The immersion lithographic apparatus according to claim 10, wherein the waveguide member is removably connectable to the radiation outlet and/or to a radiation source.

18. An immersion lithographic apparatus comprising a liquid handling system, the immersion lithographic apparatus comprising:
an exposure outlet configured to output a patterned beam of radiation onto a target portion of a substrate during exposure of the substrate; and
a barrier member and a substrate support configured to support a substrate, the barrier member and substrate support each having a surface that may be covered by immersion liquid during exposure of the substrate, the liquid handling system being configured to supply, at least partly confine, and/or remove immersion liquid during exposure of the substrate,
wherein a cleaning radiation outlet is defined in the barrier member, is, during the cleaning operation, within an opening configured to house at least part of a sensor, is, during the cleaning operation, within a passage in a movable table that can contain liquid, or is, during the cleaning operation, within a seal between an upper surface of the substrate support and at least part of a sensor, the cleaning radiation outlet, being different from the exposure outlet, is configured to output radiation for use in a cleaning operation, and is configured to direct a radiation beam at a localized portion of the immersion lithographic apparatus.

19. The immersion lithographic apparatus according to claim 18, further comprising a guide member configured to guide radiation to the radiation outlet through internal reflection of the radiation within the guide member.

20. The immersion lithographic apparatus according to claim 18, wherein the radiation outlet is in the barrier member.

21. The immersion lithographic apparatus according to claim 18, wherein the localized portion is a surface of a sensor.

22. The immersion lithographic apparatus according to claim 18, further comprising a further radiation outlet configured to direct radiation at a portion of a surface to be cleaned.

23. The immersion lithographic apparatus according to claim 18, wherein the radiation outlet is configured to output the radiation with a major cross-sectional dimension smaller than that of a final element of a projection system of the immersion lithographic apparatus.

24. The immersion lithographic apparatus according to claim 18, wherein the radiation is configured to react with hydrogen peroxide to produce a hydroxide ion or a hydroxyl radical during the cleaning operation.

25. The immersion lithographic apparatus according to claim 18, further comprising a cleaning solution supplier configured to supply a cleaning fluid between the radiation outlet and a surface to be cleaned.

26. The immersion lithographic apparatus according to claim 18, wherein, during the cleaning operation, the radiation outlet is within:
the opening configured to house at least part of the sensor;
the passage that can contain the liquid; or
the seal between the upper surface of the substrate support and at least part of the sensor.

27. A method, comprising:
supplying, at least partly confining, and/or removing immersion fluid during exposure of a substrate using a fluid handling system; and
outputting radiation for use in a cleaning operation, the radiation outlet being included in a barrier member, above a movable table, of the fluid handling system and being different from an exposure outlet.

28. A method, comprising:
supplying, at least partly confining, and/or removing immersion fluid during exposure of a substrate, on a substrate support, using a fluid handling system comprising a barrier member, the barrier member and substrate support each having a surface covered by immersion fluid during exposure of the substrate;
outputting a patterned beam of radiation, via an exposure outlet, onto a target portion of the substrate during exposure of the substrate; and
outputting from a radiation outlet, different from the exposure outlet, that is defined in the barrier member, that is within an opening configured to house at least part of a sensor, that is within a passage in a movable table that can contain fluid, or that is within a seal between an upper surface of a substrate table and at least part of the sensor, a radiation beam from an optical waveguide member and directing the radiation beam at a localized portion of the immersion lithographic apparatus, the optical waveguide member guiding, along its length, radiation for use in a cleaning operation.

29. A method, comprising:

supplying, at least partly confining, and/or removing immersion liquid during exposure of a substrate, supported on a substrate support, using a liquid handling system comprising a barrier member, the barrier member and substrate support each having a surface covered by immersion liquid during exposure of the substrate;

outputting a patterned beam of radiation, via an exposure outlet, onto a target portion of the substrate during exposure of the substrate; and outputting from a radiation outlet that is defined in the barrier member, that is within an opening configured to house at least part of a sensor, that is within a passage in a movable table that can contain liquid, or that is within a seal between an upper surface of the substrate support and at least part of a sensor, radiation for use in a cleaning operation and directing the radiation at a localized portion of the immersion lithographic apparatus, the radiation outlet being different from the exposure outlet.

\* \* \* \* \*